United States Patent
Choi et al.

(10) Patent No.: US 9,553,108 B2
(45) Date of Patent: Jan. 24, 2017

(54) ARRAY SUBSTRATE, METHOD OF MANUFACTURING THE SAME AND DISPLAY DEVICE

(71) Applicant: BOE Technology Group Co., Ltd., Beijing (CN)

(72) Inventors: Seung Jin Choi, Beijing (CN); Hee Cheol Kim, Beijing (CN); Young Suk Song, Beijing (CN); Seong Yeol Yoo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/436,930

(22) PCT Filed: Aug. 29, 2014

(86) PCT No.: PCT/CN2014/085492
§ 371 (c)(1),
(2) Date: Apr. 20, 2015

(87) PCT Pub. No.: WO2015/154367
PCT Pub. Date: Oct. 15, 2015

(65) Prior Publication Data
US 2016/0064419 A1 Mar. 3, 2016

(30) Foreign Application Priority Data
Apr. 10, 2014 (CN) .......................... 2014 1 0143525

(51) Int. Cl.
*H01L 27/12* (2006.01)
*G02F 1/1343* (2006.01)
*G02F 1/1368* (2006.01)

(52) U.S. Cl.
CPC ......... *H01L 27/1214* (2013.01); *G02F 1/1368* (2013.01); *G02F 1/134309* (2013.01); *H01L 27/127* (2013.01)

(58) Field of Classification Search
None
See application file for complete search history.

(56) References Cited

U.S. PATENT DOCUMENTS 7,851,806 B2 * 12/2010 Long ................ G02F 1/136227
257/59
7,973,888 B2 7/2011 Jung et al.
(Continued)

FOREIGN PATENT DOCUMENTS

CN 101211864 A 7/2008
CN 101614892 A 12/2009
(Continued)

OTHER PUBLICATIONS

Machine Translation of JP-2013105136.*
(Continued)

*Primary Examiner* — Joseph Schoenholtz
(74) *Attorney, Agent, or Firm* — Westman, Champlin & Koehler, P.A.

(57) ABSTRACT

The present invention discloses an array substrate, a method of manufacturing the array substrate and a display device. Since the respective surfaces of the sources, the drains and the data lines are clad by the respective insulating films, in formation of the patterns of the pixel electrodes above the insulating films by using a patterning process, the insulating films can prevent the sources and the data lines provided under them from being corroded by an etching agent when an etching process is performed to form the patterns of the pixel electrodes, so as to avoid an influence on display quality of a display panel. Furthermore, since the insulating films are formed by curing the insulating material, instead of the photoresist, remained on the patterns of the sources, the drains and the data lines when forming the patterns of the sources, the drains and the data lines by using the insulating material (replacing the photoresist), formation of the insu-
(Continued)

lating films will not increase the number of masks, and a step of peeling off the insulating material is omitted. Furthermore, the respective connecting portions electrically connects the respective drains with the respective pixel electrodes through the respective first via holes A located above the respective drains and passing through the respective insulating films, so that a normal display function of the display panel can be ensured.

13 Claims, 12 Drawing Sheets

(56) References Cited

U.S. PATENT DOCUMENTS

| | | | |
|---|---|---|---|
| 8,045,077 B2 | 10/2011 | Lim et al. | |
| 2003/0122980 A1* | 7/2003 | Jin | G02F 1/136227 349/43 |
| 2007/0298554 A1* | 12/2007 | Long | G02F 1/136227 438/160 |
| 2012/0181557 A1* | 7/2012 | Kim | H01L 27/1259 257/98 |
| 2013/0299817 A1* | 11/2013 | Park | H01L 29/45 257/43 |
| 2015/0155310 A1* | 6/2015 | Lee | H01L 27/1225 257/43 |
| 2015/0155311 A1* | 6/2015 | Lee | H01L 27/1225 257/43 |

FOREIGN PATENT DOCUMENTS

| | | | | |
|---|---|---|---|---|
| CN | 102645808 A | | 8/2012 | |
| CN | 103116232 A | | 5/2013 | |
| CN | 10394637 A | | 7/2014 | |
| CN | 103915452 A | | 7/2014 | |
| CN | 203760478 U | | 8/2014 | |
| CN | 203883007 U | | 10/2014 | |
| JP | 2013-105136 | * | 5/2013 | G06F 1/1333 |
| JP | 2013105136 A | * | 5/2013 | |

OTHER PUBLICATIONS

Machine Translation of JP 2013105136.*
International Search Report and Written Opinion for PCT Application No. PCT/CN2014/085492, dated Jan. 9, 2015, 12 pages.
First Office Action, including Search Report, for Chinese Patent Application No. 201410143525.0, dated Feb. 26, 2016, 10 pages.

* cited by examiner

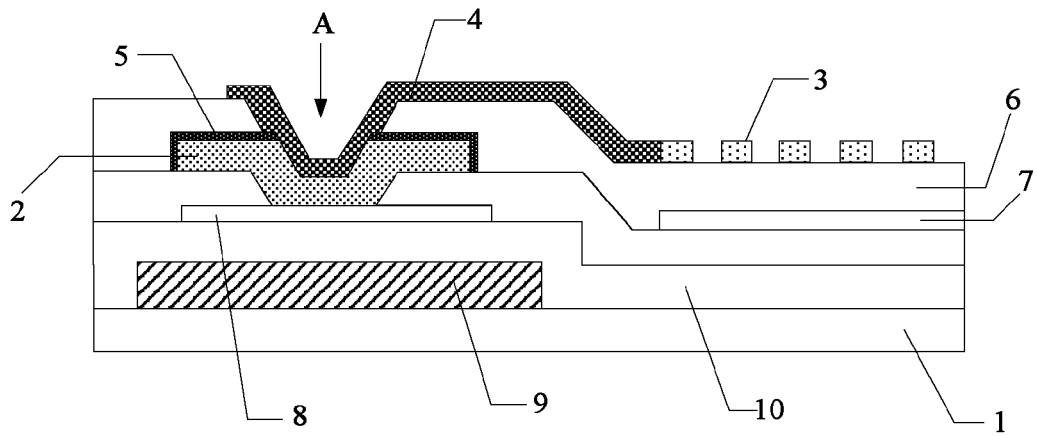

FIG. 3b forming patterns of sources, drains and data lines on a base substrate by using an insulating material, instead of a photoresist, through a one-going patterning process, wherein after the patterns of the sources, the drains and the data lines have been formed, the remained insulating material located above the patterns of the sources, the drains and the data lines is cured to form insulating films cladding surfaces of the sources, the drains and the data lines — S401 forming patterns of pixel electrodes and connecting portions on the base substrate formed with the insulating films, wherein the connecting portions electrically connect the drains with the pixel electrodes via first via holes located above the drains and passing through the insulating films — S402

Fig.4

ARRAY SUBSTRATE, METHOD OF MANUFACTURING THE SAME AND DISPLAY DEVICE

CROSS-REFERENCE TO RELATED APPLICATION

This application is a Section 371 National Stage application of International Application No. PCT/CN2014/085492, filed Aug. 29, 2014, which has not yet published, which claims priority to Chinese Patent Application No. 201410143525.0, filed Apr. 10, 2014, in Chinese, the contents of which are hereby incorporated by reference in their entirety.

BACKGROUND OF THE INVENTION

Field of the Invention

Embodiments of the present invention relate to a technical field of display, and in particular, to an array substrate, a method of manufacturing the array substrate and a display device.

Description of the Related Art

Liquid crystal display screen is mainly composed of an opposite substrate, an array substrate and a liquid crystal layer disposed between the two substrates. Generally, on a side of the array substrate, patterns such as gate lines, data lines, thin film transistors (TFT), pixel electrodes and the like are provided. The TFT specifically comprises a gate and an active layer insulated with each other, and a source and a drain electrically connected with the active layer respectively. The gate is electrically connected with the gate line, the source is electrically connected with the data line, and the drain is electrically connected with the pixel electrode. On a side of a color filter substrate, patterns such as a black matrix, a color filter layer and the like are provided.

At present, in a typical manufacturing process of the existing array substrate, patterns of gates 102 and gate lines 103 are first formed on a base substrate 101 by a one-going patterning process, as shown in FIG. 1a. Then, a gate insulating layer is formed on the base substrate 101, and a pattern of an active layer 104 is formed on a region of the gate insulating layer corresponding to the pattern of the gates 102, as shown in FIG. 1b. Subsequently, a pattern of a etch barrier layer 105 is formed, as shown in FIG. 1c. Patterns of sources 106, drains 107 and data lines 108 are formed by a one-going patterning process, as shown in FIG. 1d. Finally, a pattern of pixel electrodes 109 electrically connected with the drains 107 is formed, as shown in FIG. 1e. After the pattern of the pixel electrodes 109 has been formed, patterns of an insulating layer and a common electrode 110 are usually formed, as shown in FIG. 1f.

After formation of the patterns of the sources, the drains and the data lines, the pattern of the pixel electrodes is usually formed by a photoresist patterning process. That is, an indium tin oxide (ITO) film and a photoresist film are formed and stacked in this order on the patterns of the sources, the drains and the data lines. Then, the photoresist film is exposed and developed. Subsequently, the ITO film uncoated with the photoresist is etched by using an etching agent, in which the etched region includes the ITO film covering the patterns of the sources and the data lines. Finally, the remaining photoresist is peeled off to get the pattern of the pixel electrodes.

In a specific example, the patterns of the sources, the drains and the data lines are made of a metal, such as copper. In this way, when the ITO film covering the patterns of the sources and the data lines is etched, the etching agent will directly contact with the sources and the data lines, causing corrosion of the sources and the data lines. Furthermore, a high temperature environment, generated when the insulating layer is formed subsequently, will expedite such corrosion process, thereby adversely influencing display quality of the liquid crystal display screen.

Accordingly, how to avoid corrosion of the sources and the data lines by the etching agent is a technical problem which is needed to be solved by one skilled in the art.

SUMMARY OF THE INVENTION

Thus, embodiments of the present invention provide an array substrate, a method of manufacturing the same and a display device which can solve the problem of corrosion of a source and a data line by an etching agent in the prior art.

According to one aspect of the embodiments of the present invention, there is provided an array substrate, comprising:

a base substrate;

sources, drains and data lines provided on the base substrate;

pixel electrodes;

connecting portions; and insulating films, the respective insulating films cladding surfaces of the respective sources, the respective drains and the respective data lines;

wherein the respective insulating films clad the respective sources, the respective drains and the respective data lines, and each insulating film is provided thereon with a first via hole passing therethrough and located above the respective drain. The respective connecting portions electrically connect the respective drains with the respective pixel electrodes through the respective first via holes.

Optionally, in a case where the above array substrate according to the embodiments of the present invention is used in an advanced dimension switch type liquid crystal display screen, the substrate further comprises a passivation layer and a common electrode laminated above the pixel electrodes in this order, wherein:

the respective connecting portions and the common electrode are provided in the same layer and are insulated from each other, and the first via holes also pass through the passivation layer; the respective pixel electrodes do not overlap with the patterns of the respective sources, the respective drains and the respective data lines, and the respective connecting portions are electrically connected with the respective pixel electrodes via second via holes located above the respective pixel electrode and passing through the passivation layer.

Alternatively, in a case where the above array substrate according to the embodiments of the present invention is used in an advanced dimension switch type liquid crystal display screen, the substrate further comprises a common electrode provided between a film layer in which the pixel electrodes lie and a film layer in which the sources, the drains and the data lines lie, and a passivation layer provided between the pixel electrodes and the common electrode, wherein the common electrode does not overlap with the patterns of the drains, and the respective connecting portions and the respective pixel electrodes are provided in the same layer, and the first via holes also pass through the passivation layer.

In an optional embodiment, in order to reduce resistance of the sources, the drains and the data line, in the above array substrate according to the embodiments of the present invention, a material of the sources, the drains and the data lines is copper.

In an optional embodiment, in the above array substrate according to the embodiments of the present invention, a material of the insulating films is a resin material.

In an optional embodiment, the above array substrate according to the embodiments of the present invention further comprises active layers located under the respective sources and the respective drains and electrically connected with the respective sources and the respective drains, and gates provided opposite to the respective active layers and insulated from the respective active layers.

According to another aspect of the embodiments of the present invention, there is also provided a method of manufacturing an array substrate, comprising:

forming patterns of sources, drains and data lines on a base substrate by using an insulating material, instead of a photoresist, through a one-going patterning process, wherein after the patterns of the sources, the drains and the data lines have been formed, the remained insulating material located above the patterns of the respective sources, the respective drains and the respective data lines is cured to form insulating films cladding surfaces of the respective sources, the respective drains and the respective data lines; and forming patterns of pixel electrodes and connecting portions on the base substrate formed with the insulating films, wherein the respective connecting portions electrically connect the respective drains with the respective pixel electrodes via a first via hole located above the respective drains and passing through the respective insulating films.

In an optional embodiment, in the above manufacturing method according to the embodiments of the present invention, the step of forming the patterns of the pixel electrodes on the base substrate comprises forming the patterns of the pixel electrodes, which do not overlap with the patterns of the sources, the drains and the data lines, on the base substrate. In a case where the array substrate manufactured by the above manufacturing method according to the embodiments of the present invention is used in an advanced dimension switch type liquid crystal display screen, the method further comprises: forming a film of passivation layer on the base substrate formed with the patterns of the pixel electrodes, forming the respective first via holes in the film of passivation layer and the respective insulating films provided above the respective drains by an etching process, and forming second via holes in the film of passivation layer provided above the respective pixel electrodes; and forming on the pattern of the film of passivation layer patterns of a common electrode and connecting portions insulated from each other, wherein the respective connecting portions are electrically connected with the respective drains through the respective first via holes and are electrically connected with the respective pixel electrodes through the respective second via holes.

Alternatively, in particular, in a case where the array substrate manufactured by the above manufacturing method according to the embodiments of the present invention is used in an advanced dimension switch type liquid crystal display screen, before forming the patterns of the pixel electrodes and the connecting portions on the base substrate, the method further comprise:

forming a pattern of a common electrode, which does not overlap with the patterns of the drains, on the base substrate; and forming a film of passivation layer on the base substrate formed with the pattern of the common electrode, and forming the first via holes in the film of passivation layer and the respective insulating films provided above the respective drains by an etching process. The step of forming the patterns of the pixel electrodes and the connecting portions on the base substrate comprises forming on the pattern of the passivation layer the patterns of the respective pixel electrodes and the respective connecting portions electrically connected with each other, and the respective connecting portions are electrically connected with the respective drains through the respective first via holes.

In an optional embodiment, in order to ensure that the formed insulating films have suitable thickness, in the above manufacturing method according to the embodiments of the present invention, the step of curing the insulating material remained above the patterns of the sources, the drains and the data lines comprises heating the insulating material remained above the patterns of the sources, the drains and the data lines. A heating temperature is 150° C. to 220° C., and a time duration for heating is 10 minutes to 2 hours.

In an optional embodiment, in the above manufacturing method according to the embodiments of the present invention, before forming the patterns of the sources, the drains and the data lines on the base substrate, the method further comprises forming patterns of gates and gate lines on the base substrate by a one-going patterning process, forming a gate insulating layer on the base substrate formed with the patterns of the gates and the gate lines, forming patterns of active layers on a region of the gate insulating layer corresponding to the gates, and forming a pattern of an etch barrier layer on the base substrate formed with the patterns of the active layers.

According to a further aspect of the embodiments of the present invention, there is further provided a display device including the above array substrate according to the embodiments of the present invention.

BRIEF DESCRIPTION OF THE DRAWINGS

FIGS. 3a and 3b are schematic structure views of the array substrates according to exemplary embodiments of the present invention, respectively;

FIG. 4 is a flow chart of a method of manufacturing the array substrate according to an exemplary embodiment of the present invention;

DETAILED DESCRIPTION OF EMBODIMENTS OF THE INVENTION

Next, the array substrate, the method of manufacturing the same and the display device according to embodiments of the present invention, in combination with the accompanying drawings, will be explained in detail. Obviously, the described embodiments are only parts of embodiments of the present invention, not all embodiments of the present invention. Based on the teaching from the following embodiments of the present invention, all other embodiments obtained by one skilled in the art without paying any inventive efforts fall within the scope of the present invention.

Shapes and thickness of respective films and layers do not reflect the real scale of the array substrate in the accompanying drawings, and only are intended to schematically illustrate the present invention.

Figure 1A:
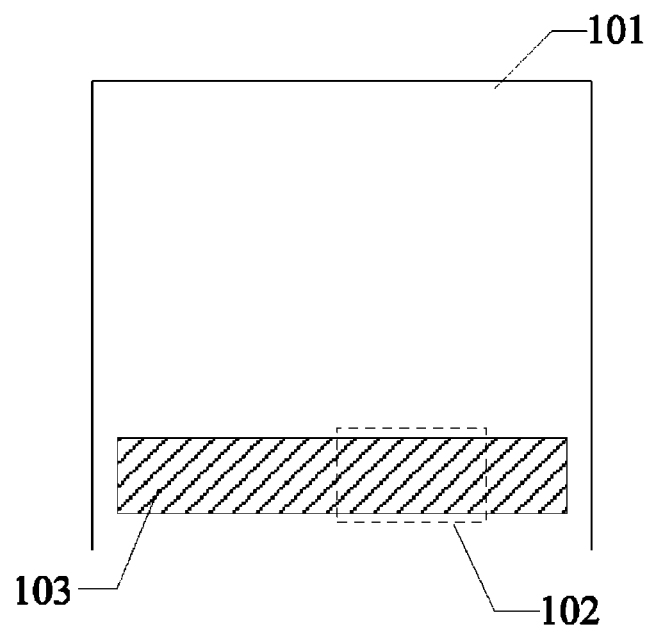
FIGS. 1a-1f show respective schematic views of structures of an array substrate in respective steps of a method of manufacturing the array substrate in the prior art.
Figure 1B:
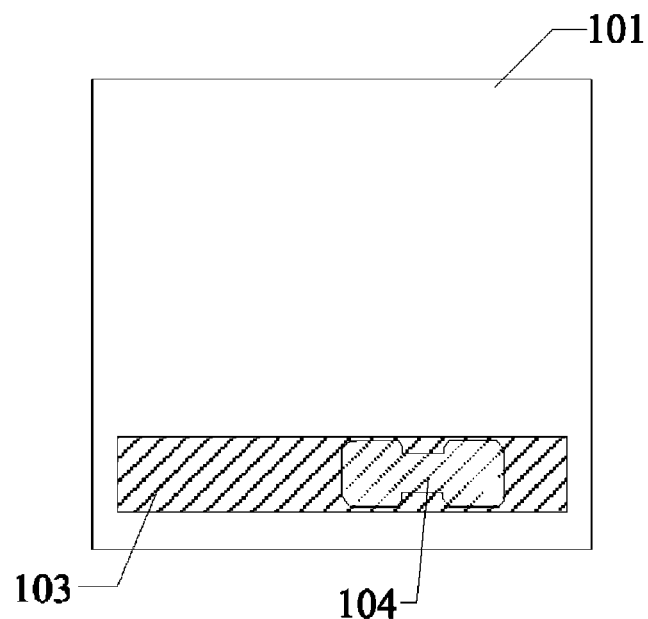
Figure 1C:
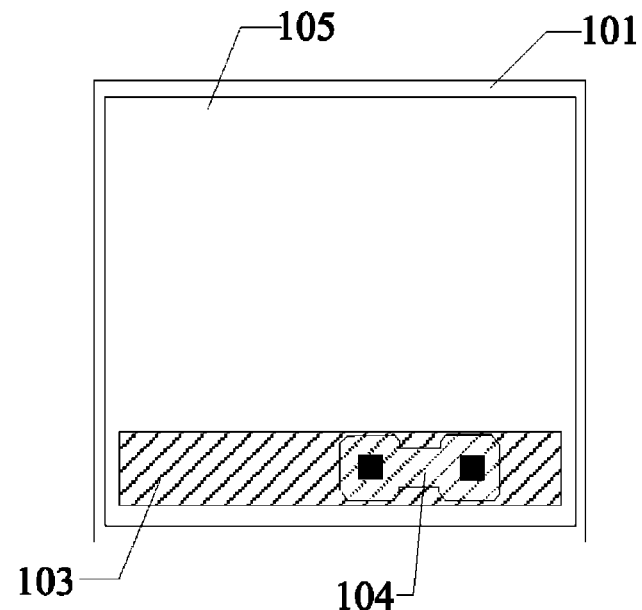
Figure 1D:
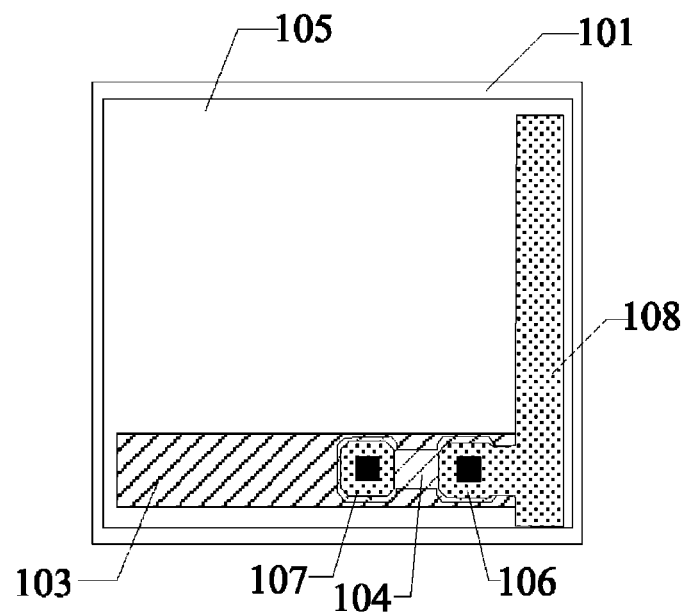
Figure 1E:
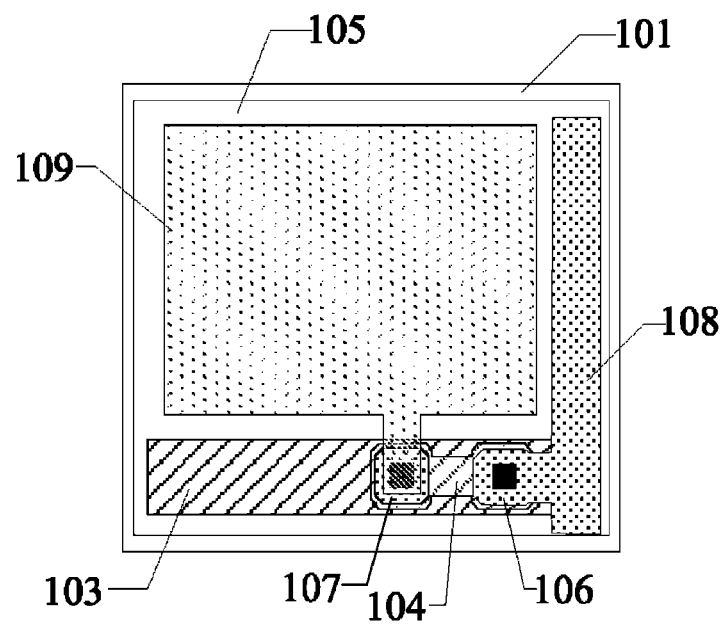
Figure 1F:
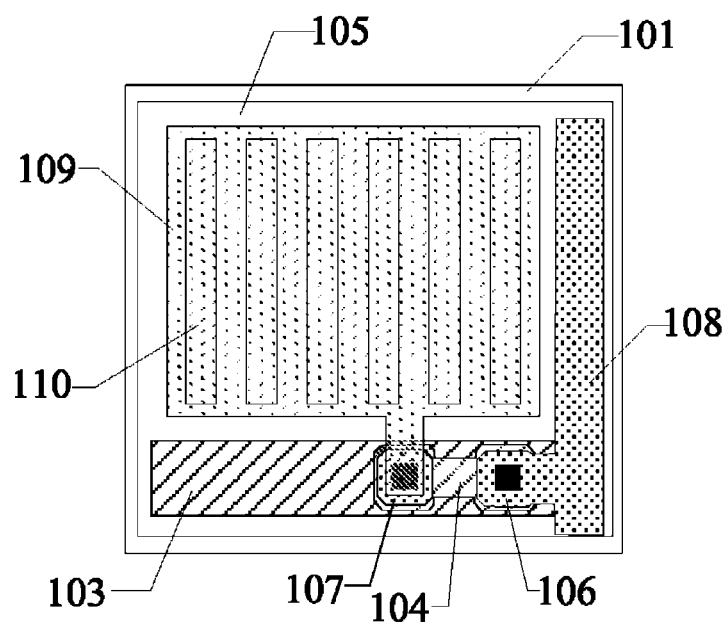
Figure 2:
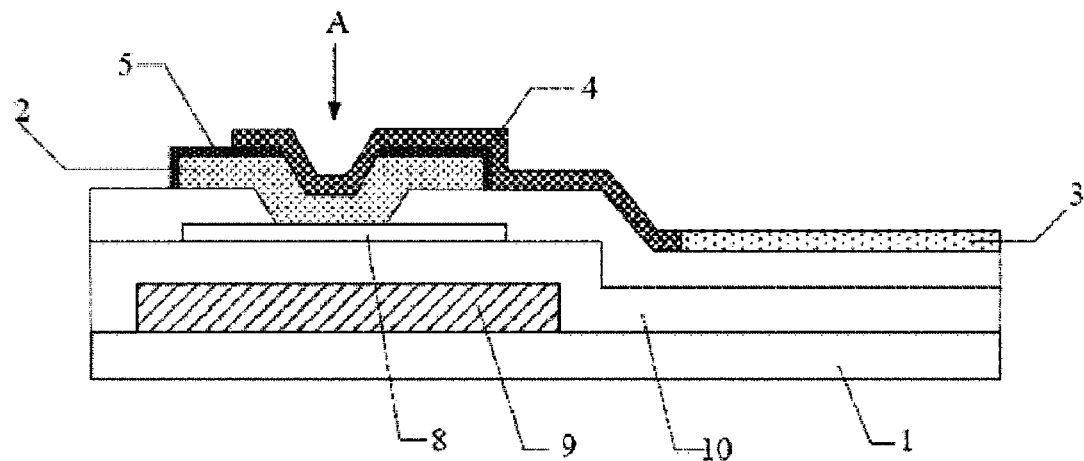
FIG. 2 is a schematic structure view of the array substrate according to an exemplary embodiment of the present invention, used in a TN type liquid crystal display screen.

As shown in FIG. 2, the array substrate according to an embodiment of the present invention comprises:

a base substrate 1;

a source, a drain 2 and a data line provided on the base substrate 1;

a pixel electrode 3 provided in a film layer in which the source, the drain 2 and the data line are located;

a connecting portion 4; and an insulating film 5 cladding surfaces of the source, the drain 2 and the data line;

wherein the insulating film 5 clads the source, the drain and the data line, and the insulating film 5 is provided thereon with a first via hole A which is provided above the drain and passes through the insulating film. The connecting portion electrically connects the drain 2 with the pixel electrode 3 through the first via hole A.

It should be noted although FIG. 2 only shows a structure of one pixel unit provided on the base substrate, the base substrate area substantially provided thereon with a plurality of pixel units. In the following description, for purpose of simplifying the description, the description only refers to a structure of one pixel unit, and other pixel units provided on the base substrate have the same or similar structure.

The insulating film 5 is formed by curing an insulating material remained on the patterns of the source, the drain 2 and the data line when the insulating material replaces a photoresist to form the patterns of the source, the drain 2 and the data line.

FIG. 2 and FIGS. 3a, 3b, 5e, 5f, 5g, 8a, 8b described hereafter only show the drain 2, rather than the source and the data line. However, one skilled in the art can understand that the data line and the source are also clad by the insulating film.

Herein, "clad" means that the insulating film 5 completely covers the exposed portions of the drain, the source and the data line.

In the array substrate according to the embodiment of the present invention, since the surfaces of the source, the drain 2 and the data line are clad by the insulating film 5, in formation of the pattern of the pixel electrode 3 above the insulating film 5 by using a patterning process, the insulating film 5 can prevent the source and the data line below from being corroded by an etching agent when an etching process is performed to form the pattern of the pixel electrode 3, so as to avoid an influence on display quality of a display panel. At the same time, the insulating film 5 can also effectively prevent short circuit between the source or the data line and the pixel electrode 3. Since the insulating film 5 is formed by curing the insulating material, instead of the photoresist, remained on the patterns of the source, the drain 2 and the data line when forming the patterns of the source, the drain 2 and the data line by using the insulating material (replacing the photoresist) through a one-going patterning process, formation of the insulating film 5 will not increase the number of masks, compared to the prior art. Also, after the etching step in the patterning process is performed to form the patters of the source, the drain 2 and the data line, a step of peeling off the insulating material is omitted. Furthermore, the connecting portion 4 electrically connects the drain 2 with the pixel electrode 3 through the first via hole A located above the drain 2 and passing through the insulating film 5, so that a normal display function of the display panel can be ensured.

In a specific embodiment, curing the insulating material remained above the patterns of the source, the drain 2 and the data line can be realized by heating the insulating material remained above the patterns of the source, the drain 2 and the data line. The heating temperature is controlled within a range of 150-220° C. The time duration for heating is controlled within a range of 10 min to 2 hours.

For different insulating materials, different curing processes may be used.

In a specific embodiment, the material for the insulating film 5 may, in particular, be a resin material. When the resin material is used to replace the photoresist to form the patterns of the source, the drain 2 and the data line by a patterning process, the resin material can flow down to completely clad the surfaces of the source, the drain 2 and the data line by curing the resin material remained on the patterns of the source, the drain 2 and the date line, so as to form the insulating film 5. Since curing the photoresist cannot make it flow down and completely clad the surfaces of the source, the drain 2 and the data line, the resin material is used to replace the photoresist to form the patterns of the source, the drain 2 and the data line.

Material for the insulating material 5 is not limited to the resin material, any insulating material that can clad the source, the drain 2 and the data line upon being cured may be used.

In a specific embodiment, the above array substrate according to the embodiment of the present invention may be used in a Twisted Nematic (TN) type liquid crystal display screen, as shown in FIG. 2, or may be used in an Advanced Dimension Switch (ADS) type liquid crystal display screen.

Figure 3A:
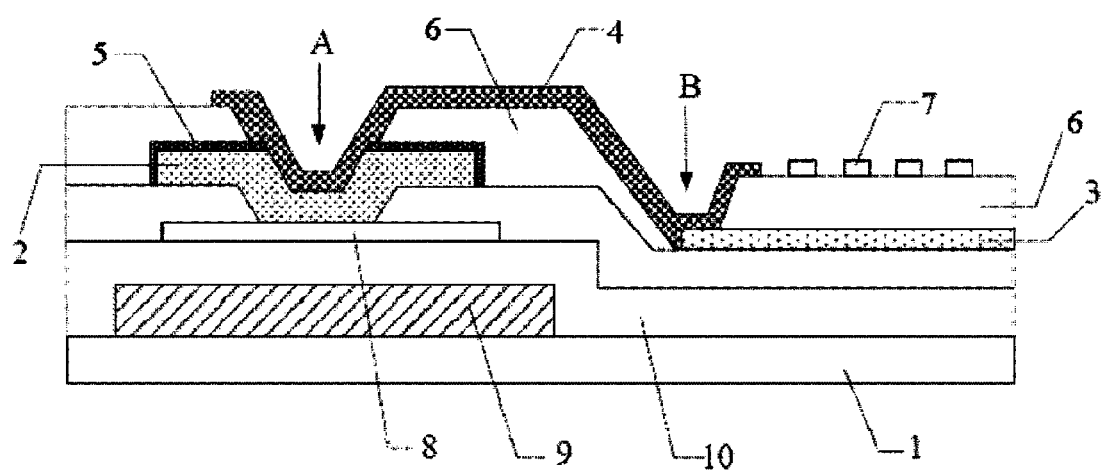

In a case where the above array substrate according to the embodiment of the present invention is used in an ADS type liquid crystal display screen, as shown in FIG. 3a, the array substrate further comprises a passivation layer 6 and a common electrode 7 sequentially laminated above the pixel electrode 3. The connecting portion 4 and the common electrode 7 are provided in the same layer and are insulated from each other. That is, the patterns of the connecting portion 4 and the common electrode 7 are formed with the same material (e.g., Indium Tin Oxides (ITO), or Indium Zinc Oxides (IZO)) by a one-going patterning process, and the first via hole A passes through the passivation layer 6, i.e., the first via hole A passes through the insulating film 5 and the passivation layer 6. The pattern of the pixel electrode 3 does not overlap with the patterns of the source, the drain 2 and the data line. The connecting portion 4 is electrically connected to the pixel electrode 3 through a second via hole B located above the pixel electrode 3 and passing through the passivation layer 6. In this way, the drain 2 is electrically connected to the pixel electrode 3 through the connecting portion 4.

Or, in a case where the above array substrate according to the embodiment of the present invention is used in the ADS type liquid crystal display screen, as shown in FIG. 3b, the array substrate further comprises a common electrode 7 provided between a film layer in which the pixel electrode 3 lies and another film layer in which the source, the drain 2 and the data line lie, and a passivation layer 6 provided between the pixel electrode 3 and the common electrode 7. The pattern of the common electrode 7 does not overlap with the pattern of the drain 2. The connecting portion 4 and the pixel electrode 3 are provided in the same layer. That is, the patterns of the connecting portion 4 and the pixel electrode 3 are formed with the same material (e.g., Indium Tin Oxides (ITO), or Indium Zinc Oxides (IZO)) by a one-going patterning process, and the first via hole A also passes through the passivation layer 6, i.e., the first via hole A passes through the insulating film 5 and the passivation layer 6. The connecting portion 4 is electrically connected to the drain 2 through a first via hole A located above the drain 2 and passing through the insulating film 5 and the passivation layer 6. In this way, the drain 2 is electrically connected to the pixel electrode 3 through the connecting portion 4.

In an optional embodiment, in order to reduce the resistance of the source, the drain 2 and the data line, the patterns of the source, the drain 2 and the data line are generally formed by copper. However, it should be noted that the present invention is not limited to this and other metal may be used to form the patterns of the source, the drain 2 and the data line.

Since there is a poor adhesion between the copper and the base substrate 1 or other film layers, a buffer layer, such as MoNb, MoTi or MoW, may be provided under the copper, so as to prevent copper ions from diffusing into the active layer and to improve the adhesion between the copper and the base substrate 1 or other film layers.

In a specific embodiment of the above array substrate according to the embodiment of the present invention, thin film transistors in the array substrate may have bottom gate type structures, as shown in FIGS. 2, 3a and 3b. The array substrate further comprises an active layer 8 provided under the source and the drain 2 and electrically connected with the source and the drain 2, and a gate 9 insulated from the active layer 8 and provided opposite to the active layer 8. Specifically, a gate insulating layer 10 may be provided between the gate 9 and the active layer 8, so as to insulate the gate 9 and the active layer 8 from each other.

Alternatively, the thin film transistors in the array substrate may have top gate type structures, that is, the active layer 8 is provided above the source and the drain 2 and is electrically connected with the source and the drain 2, and the gate 9 is insulated from the active layer 8 and is opposite to the active layer 8. The present invention does not limit this.

Based on the same inventive concept, the embodiment of the present invention further provides a method of manufacturing an array substrate, as shown in FIG. 4, including the steps of:

S401 forming patterns of a source, a drain and a data line on a substrate by using an insulating material, instead of a photoresist, through a one-going patterning process, wherein after the patterns of the source, the drain and the data line have been formed by performing an etching step in the patterning process, the insulating material remained above the patterns of the source, the drain and the data line is cured to form an insulating film cladding surfaces of the source, the drain and the data line.

In a specific embodiment, in order to reduce the resistance of the source, the drain and the data line, the patterns of the source, the drain and the data line are generally formed by metal such as copper, on the substrate through the one-going patterning process. However, it should be noted that the present invention is not limited to this and other metals may be used to form the patterns of the source, the drain and the data line.

Optionally, in order to prevent copper ions from diffusing into the active layer, a buffer layer, such as MoNb, MoTi or MoW, may be formed before forming the patterns of the source, the drain and the date line by the copper. In this way, an adhesion between the copper and the base substrate or other film layers also can be improved.

S402 forming patterns of a pixel electrode and a connecting portion on the substrate formed with the insulating film, wherein the connecting portion electrically connects the drain with the pixel electrode through a first via hole located above the drain and passing through the insulating film.

The method of manufacturing the above array substrate according to the embodiment of the present invention also can realize the same advantages as those realized by the array substrate according to the embodiment of the present invention.

In a specific embodiment, in the manufacturing method according to the embodiment of the present invention, the step S402 of forming the pattern of the pixel electrode on the base substrate may, in particular, include forming on the base substrate the pattern of the pixel electrodes that does not overlap with the patterns of the sources, the drains and the data lines. Furthermore, in a case where the array substrate manufactured by the manufacturing method according to the embodiment of the present invention is used in an ADS type liquid crystal display screen, the manufacturing method according to the embodiment of the present invention further comprises:

firstly, forming a film of passivation layer on the base substrate formed with the pattern of the pixel electrode, forming the first via hole in the film of passivation layer and the insulating film provided above the drain by an etching process, and forming a second via hole in the film of passivation layer provided above the pixel electrode while forming the first via hole;

then, forming on the pattern of the film of passivation layer patterns of a common electrode and a connecting portion insulated from each other, wherein the connecting portion is electrically connected with the drain through the first via hole and is electrically connected with the pixel electrode through the second via hole.

Alternatively, in a case where the array substrate manufactured by the above manufacturing method according to the embodiments of the present invention is used in an ADS type liquid crystal display screen, before forming the patterns of the pixel electrodes and the connecting portions on the base substrate, the step S402 in the above manufacturing method according to the embodiments of the present invention further comprise:

firstly, forming a pattern of a common electrode, which does not overlap with the pattern of the drain, on the base substrate; and then, forming a film of passivation layer on the base substrate formed with the pattern of the common electrode, and forming the first via hole in the film of passivation layer and the insulating film provided above the drain by an etching process.

In a specific embodiment, in the above manufacturing method according to the embodiments of the present invention, the step S402 of forming the patterns of the pixel electrode and the connecting portion on the base substrate comprises forming on the pattern of the passivation layer the patterns of the pixel electrode and the connecting portion electrically connected with each other, and the connecting portion is electrically connected with the drain through the first via hole.

In an optional embodiment, in order to ensure that the formed insulating film has a suitable thickness, in the above manufacturing method according to the embodiments of the present invention, the step S401 of curing the insulating material remained above the patterns of the source, the drain and the data line in particular comprises heating the insulating material remained above the patterns of the source, the drain and the data line. A heating temperature is controlled within a range of 150° C. to 220° C., and a time duration for heating is controlled within a range of 10 minutes to 2 hours.

In a specific embodiment, taking the array substrate with thin film transistors having bottom gate type structures as an example, in the above manufacturing method according to the embodiments of the present invention, before forming the patterns of the source, the drain and the data line on the substrate, the step S401 further comprises:

firstly, forming patterns of a gate and a gate line on the base substrate by a one-going patterning process;

then, forming a gate insulating layer on the base substrate formed with the patterns of the gate and the gate line;

subsequently, forming a pattern of an active layer on a region of the gate insulating layer corresponding to the gate; and finally, forming a pattern of an etch barrier layer on the base substrate formed with the pattern of the active layer.

Next, a specific implementation of the method of manufacturing the array substrate which has the above-described two structures (the connecting portion and the common electrode or the pixel electrode are provided in the same layer) and is used in an ADS type liquid crystal display screen will be described in detail through two specific examples.

Figure 5A:
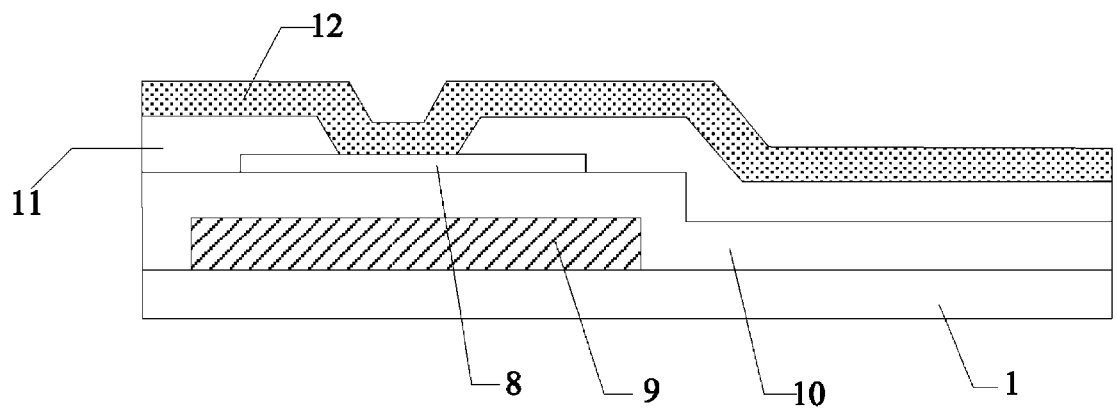
FIGS. 5a-5g show respective side views of the array substrate in respective steps of the method of manufacturing the array substrate according to a first exemplary embodiment of the present invention.
Figure 5B:
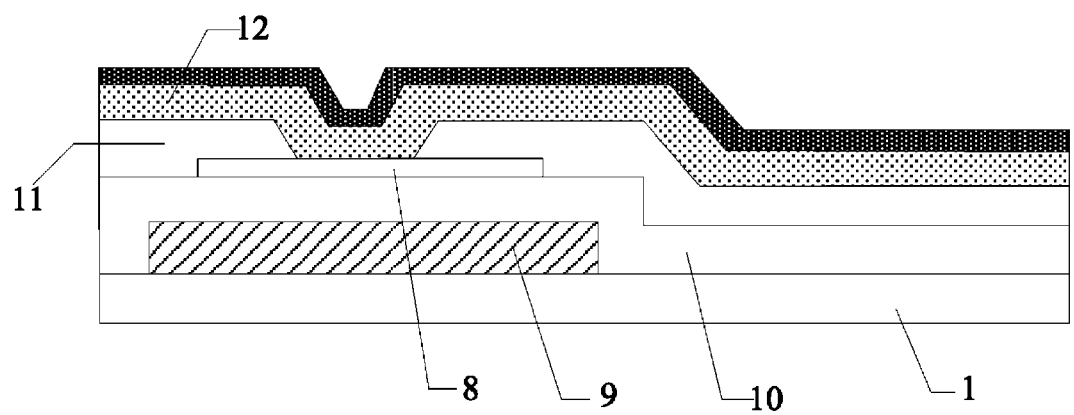
Figure 5C:
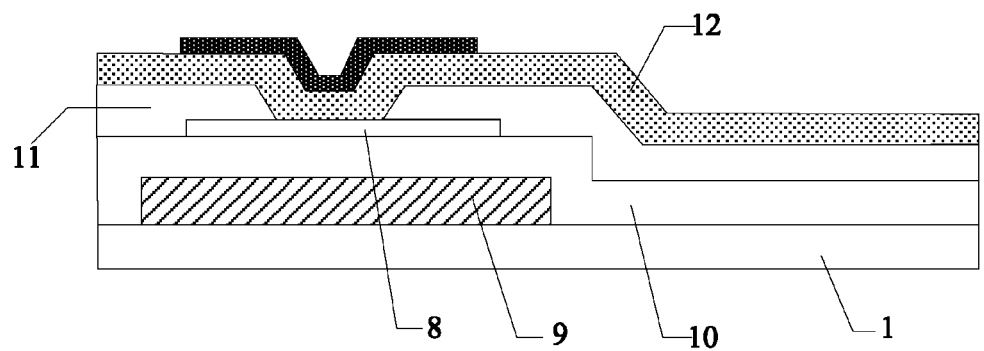
Figure 5D:
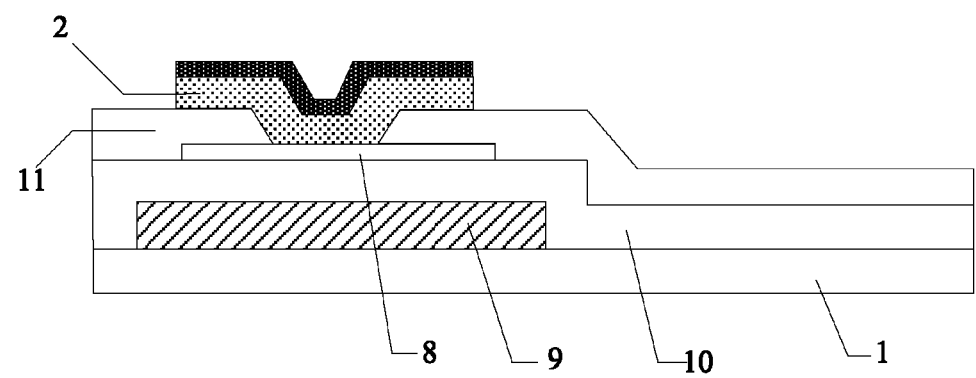

In a case where the connecting portion and the common electrode are provided in the same layer, the method of manufacturing the array substrate may comprise the following steps:

1. forming patterns of a gate and a gate line on the base substrate by a one-going patterning process;
2. forming a gate insulating layer on the base substrate formed with the patterns of the gate and the gate line;
3. forming a pattern of the active layer on a region of the gate insulating layer corresponding to the gate;
4. forming a pattern of an etch barrier layer on the base substrate formed with the pattern of the active layer;
5. forming a metal film 12 on the base substrate 1 formed with the pattern of the etch barrier layer 11, as shown in FIG. 5a;
6. coating a layer of resin material onto the base substrate 1 formed with the metal film 12, as shown in FIG. 5b;
7. exposing and developing the resin material, as shown in FIG. 5c;
8. etching portions of the metal film 12 uncovered with the resin material to form the patterns of the source, the drain 2 and the data line, as shown in FIG. 5d.

In the method of manufacturing the array substrate according to the embodiment of the present invention, the above steps 1-8 are not modified and are identical with those in the prior art. Therefore, detailed description of these steps is omitted.

Figure 5E:
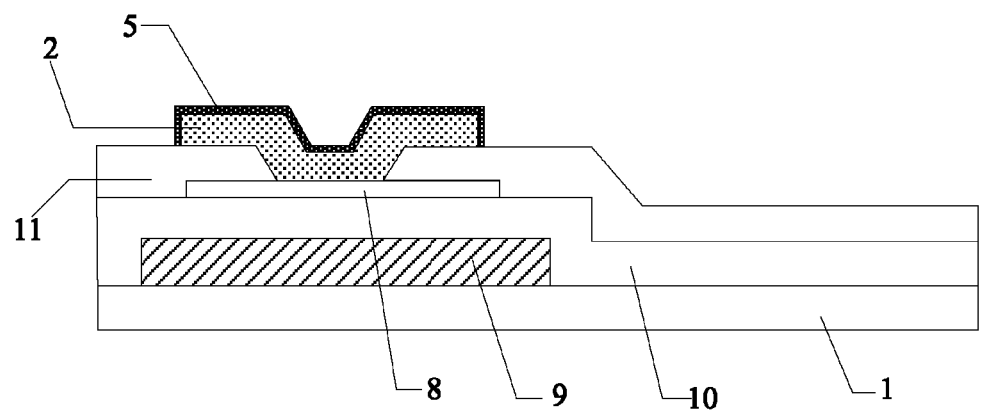

9. curing the resin material remained above the patterns of the source, the drain 2 and the data line to form a pattern of the insulating film 5, as shown in FIG. 5e.

In a specific embodiment, curing the resin material remained above the patterns of the source, the drain 2 and the data line can make the resin material flow down and completely clad surfaces of the source, the drain 2 and the data line, so as to form the pattern of the insulating film 5.

Figure 5F:
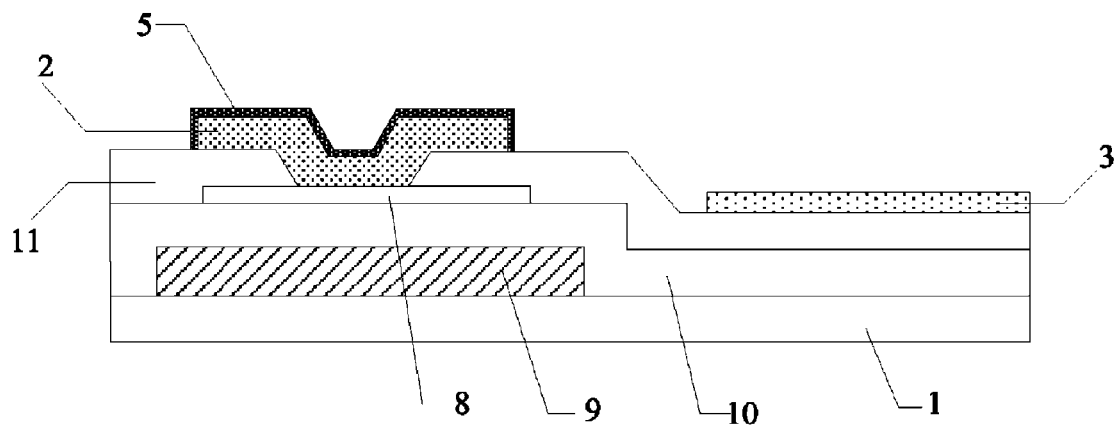
Figure 5G:
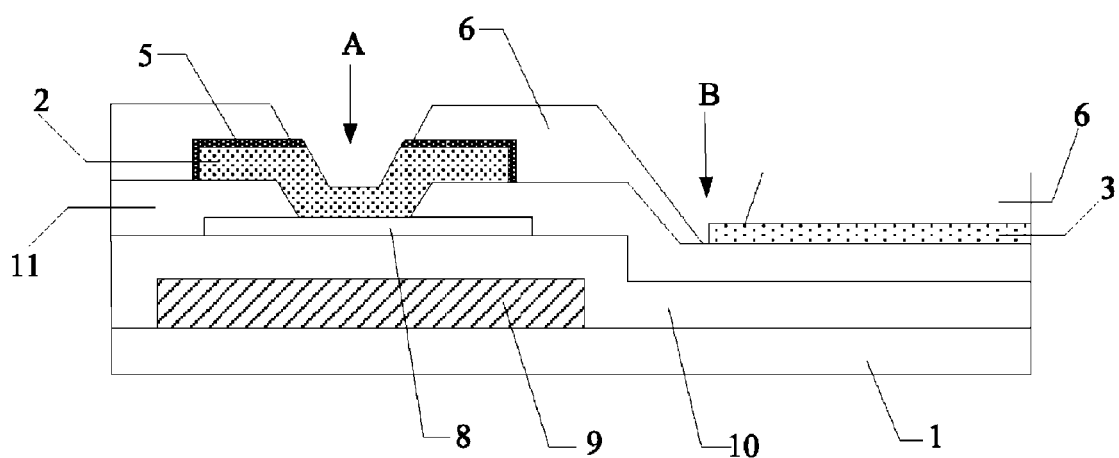
Figure 6A:
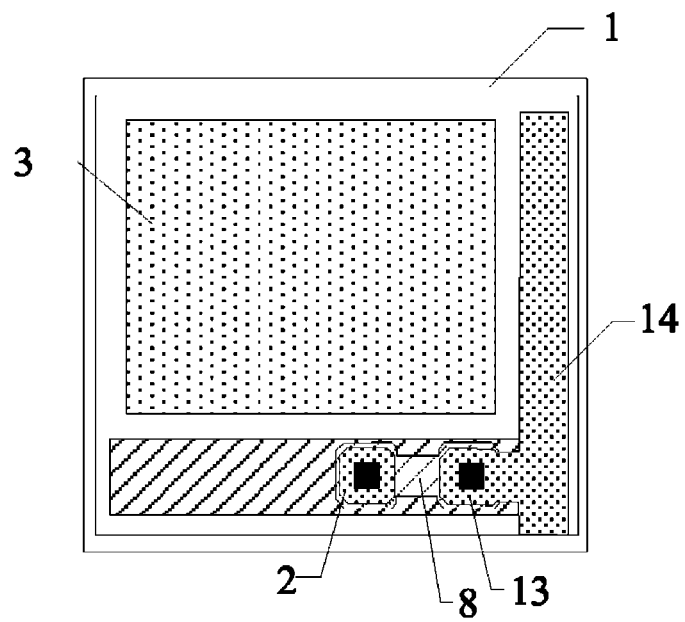
FIGS. 6a, 6b and 6c are top views corresponding to FIG. 5f, FIG. 5g and FIG. 3a, respectively.
Figure 6B:
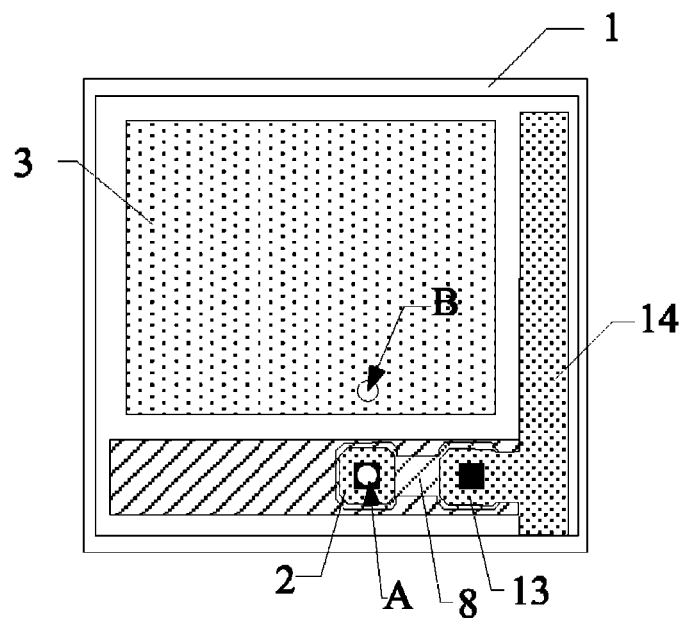
Figure 6C:
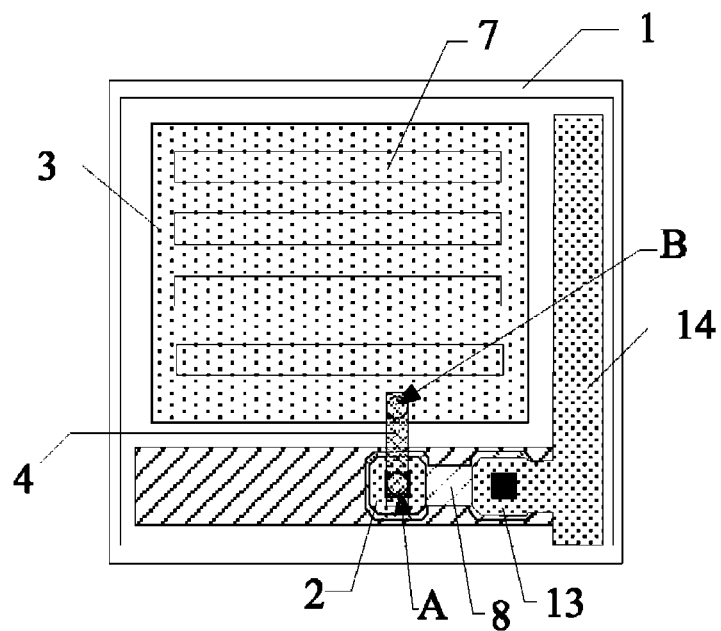

10. forming a pattern of the pixel electrode 3, which does not overlap with the patterns of the source 13 (not shown in FIG. 5f), the drain 2 and the data line 14 (not shown in FIG. 5f), on the base substrate 1 formed with the insulating film 5 (not shown in FIG. 6a), as shown in FIGS. 5f and 6a;

11. forming a film of passivation layer 6 (not shown in FIG. 6b) on the base substrate 1 formed with the pattern of the pixel electrode 3, and forming a first via hole A in the film of passivation layer 6 and the insulating film 5 (not shown in FIG. 6b) located above the drain 2 by an etching process; forming a second via hole B in the film of passivation layer 6 located above the pixel electrode 3 while forming the first via hole A, as shown in FIGS. 5g and 6b;

12. forming patterns of the common electrode 7 and the connecting portion 4, which are insulated from each other, on the pattern of the passivation layer 6 (not shown in FIG. 6c) by using a one-going patterning process, wherein the connecting portion 4 is electrically connected with the drain 2 through the first via hole A and is electrically connected with the pixel electrode 3 through the second via hole B, as shown in FIGS. 6c and 3a.

In a case where the connecting portion and the pixel electrode are provided in the same layer, the method of manufacturing the array substrate may comprise the following steps:

1. forming patterns of a gate and a gate line on the base substrate by a one-going patterning process;
2. forming a gate insulating layer on the base substrate formed with the patterns of the gate and the gate line;
3. forming a pattern of the active layer on a region of the gate insulating layer corresponding to the gate;
4. forming a pattern of an etch barrier layer on the base substrate formed with the pattern of the active layer;
5. forming a metal film 12 on the base substrate 1 formed with the pattern of the etch barrier layer 11, as shown in FIG. 5a;
6. coating a layer of resin material onto the base substrate 1 formed with the metal film 12, as shown in FIG. 5b;
7. exposing and developing the resin material, as shown in FIG. 5c;
8. etching portions of the metal film 12 uncovered with the resin material to form the patterns of the source, the drain 2 and the data line, as shown in FIG. 5d.

In the method of manufacturing the array substrate according to the embodiments of the present invention, the above steps 1-8 are not modified and are identical with those in the prior art. Therefore, detailed description of these steps is omitted herein.

9. curing the resin material remained above the patterns of the source, the drain 2 and the data line to form a pattern of the insulating film 5, as shown in FIG. 5e.

In a specific embodiment, curing the resin material remained above the patterns of the source, the drain 2 and the data line can make the resin material flow down and completely clad surfaces of the source, the drain 2 and the data line, so as to form the pattern of the insulating film 5.

Figure 7A:
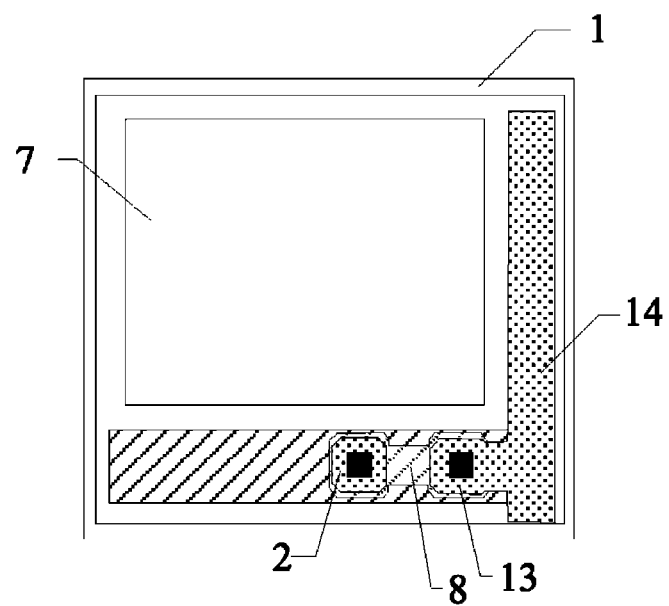
FIGS. 7a-7c show respective top views of the array substrate in respective steps of the method of manufacturing the array substrate according to a second exemplary embodiment of the present invention.
Figure 7B:
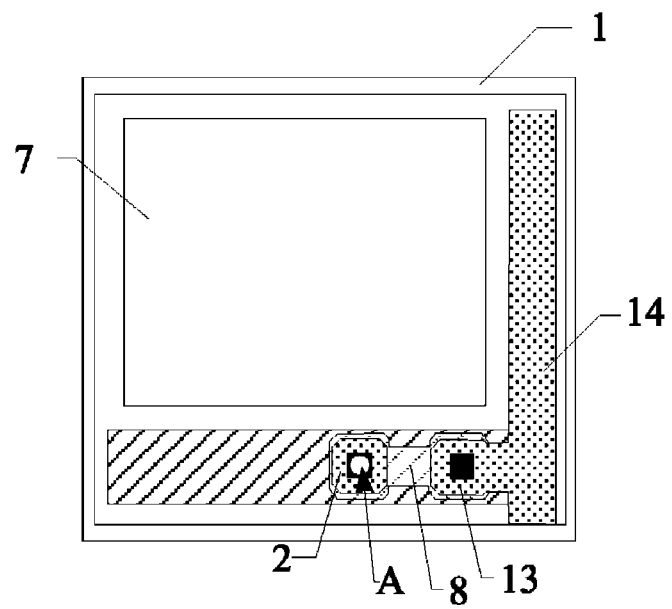
Figure 7C:
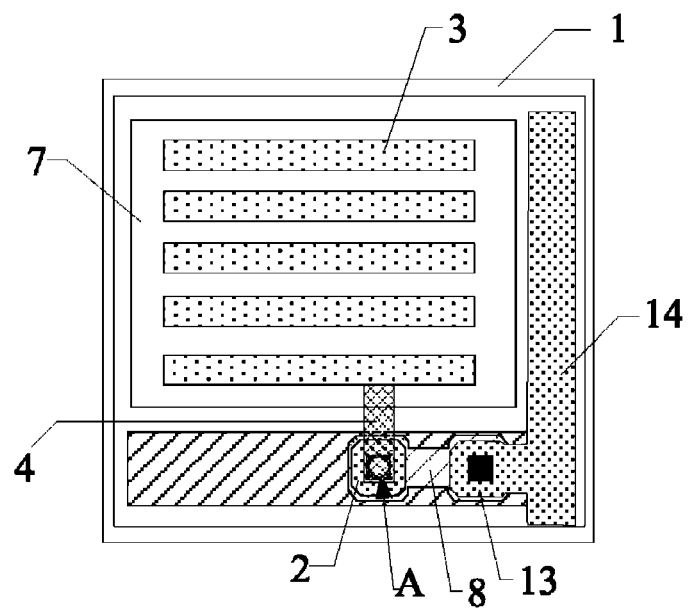
Figure 8A:
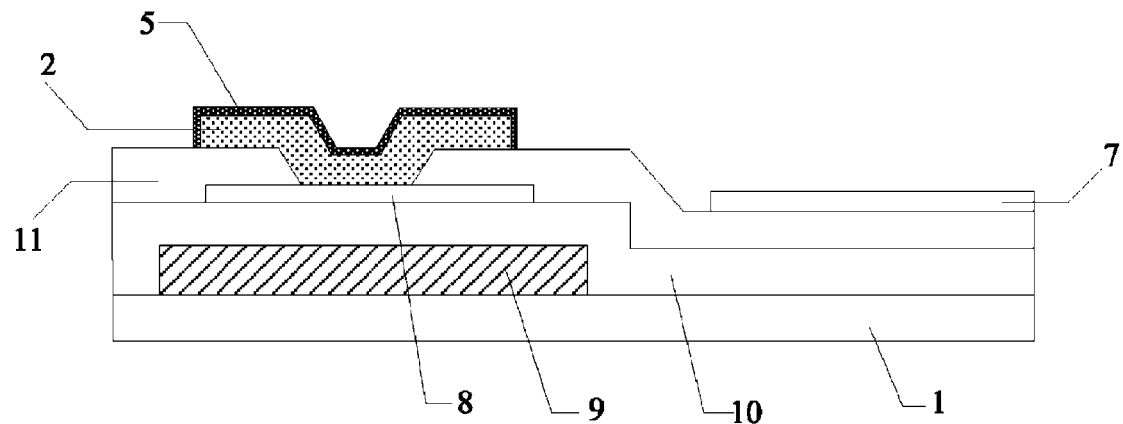
FIGS. 8a and 8b are side views corresponding to FIG. 7a and FIG. 7b, respectively.
Figure 8B:
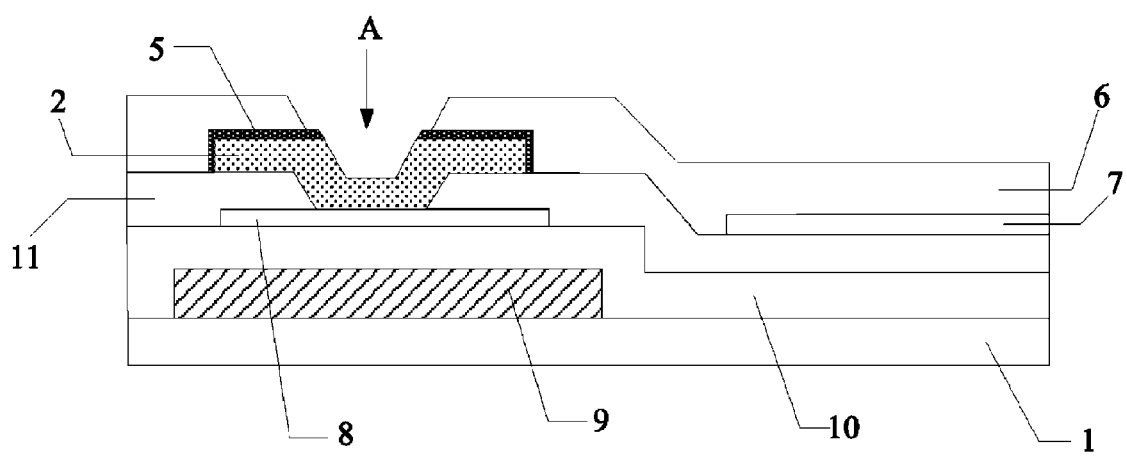

10. forming a pattern of the common electrode 7, which does not overlap with the patterns of the source 13 (not shown in FIG. 8a), the drain 2 and the data line 14 (not shown in FIG. 8a), on the base substrate 1 formed with the insulating film 5 (not shown in FIG. 7a), as shown in FIGS. 7a and 8a;

11. forming a film of passivation layer 6 (not shown in FIG. 7b) on the base substrate 1 formed with the pattern of the common electrode 7, and forming a first via hole A in the film of passivation layer 6 and the insulating film 5 (not shown in FIG. 7b) located above the drain 2 by an etching process, as shown in FIGS. 7b and 8b;

12. forming patterns of the pixel electrode 3 and the connecting portion 4, which are electrically connected with each other, on the pattern of the passivation layer 6 (not shown in FIG. 7c) by using a one-going patterning process, wherein the connecting portion 4 is electrically connected with the drain 2 through the first via hole A, as shown in FIGS. 7c and 3b.

Based on the same inventive concept, the embodiments of the present invention also provide a display device, including the above array substrate according to the embodiments of the present invention. The display device may be any product or component which provides any display function, such as a mobile phone, a flat computer, a TV, a display, a notebook computer, a digital picture frame, a navigator and the like Implementations for the display device can refer to the embodiments of the above array substrate and will not be described herein.

It is obvious that any modifications and alternations to the present invention can be made without departing from spirits and scope of the present invention. In this way, if the above modifications and alternations to the present invention belong to the pending claims of present invention and its equivalents, then the present invention is intended to incorporate these modifications and alternations.

What is claimed is:

1. An array substrate, comprising:
a base substrate;
sources, drains and data lines provided on the base substrate;
pixel electrodes and a common electrode;
connecting portions;
insulating films, the respective insulating films cladding the respective sources, the respective drains and the respective data lines;
wherein each insulating film is provided thereon with a first via hole passing therethrough and located above the respective drain, and the respective connecting portions electrically connect the respective drains with the respective pixel electrodes through the respective first via holes; and
a passivation layer, at least a part of which is provided between the pixel electrodes and the common electrode, the first via hole passing through the passivation layer;
the passivation layer and the common electrode are subsequently laminated above the pixel electrodes, the respective layer connecting portions and the common electrode are provided in the same layer and are insulated from each other;
the respective pixel electrodes do not overlap with the patterns of the respective sources, the respective drains and the respective data lines, and the respective connecting portions are electrically connected with the respective pixel electrode via second via holes located above the respective pixel electrode and passing through the passivation layer.

2. The array substrate according to claim 1, wherein:
a material of the insulating films is a resin material.

3. The array substrate according to claim 1, wherein:
a material of the sources, the drains and the data lines is copper.

4. The array substrate according to claim 1, further comprising:

active layers located under the respective sources and the respective drains and electrically connected with the respective sources and the respective drains; and
gates provided opposite to the respective active layers and insulated from the respective active layers.

5. A method of manufacturing an array substrate, comprising the steps of:
forming patterns of sources, drains and data lines on a base substrate by using an insulating material, instead of a photoresist, through a one-going patterning process, wherein after the patterns of the respective sources, the respective drains and the respective data lines have been formed, the remained insulating material located above the patterns of the respective sources, the respective drains and the respective data lines is cured to form insulating films cladding surfaces of the respective sources, the respective drains and the respective data lines; and
forming patterns of a film of passivation layer, pixel electrodes and connecting portions on the base substrate formed with the insulating films, wherein the respective connecting portions electrically connects the respective drains with the respective pixel electrodes via a first via hole located above the respective drains and passing through the film of passivation layer and the respective insulating films.

6. The method according to claim 5, wherein:
the step of forming the patterns of the pixel electrodes on the base substrate comprises forming the patterns of the pixel electrodes, which do not overlap with the patterns of the sources, the drains and the data lines, on the base substrate,
wherein the method further comprises:
forming the film of passivation layer on the base substrate formed with the patterns of the pixel electrodes, forming the respective first via holes in the film of passivation layer and the respective insulating films provided above the respective drains by an etching process, and forming second via holes in the film of passivation layer provided above the respective pixel electrodes; and
forming on the pattern of the film of passivation layer patterns of common electrodes and connecting portions insulated from each other, wherein the respective connecting portions are electrically connected with the respective drains through the respective first via holes and are electrically connected with the respective pixel electrodes through the respective second via holes.

7. The method according to claim 5, wherein:
before forming the patterns of the pixel electrodes and the connecting portions on the base substrate, the method further comprise: forming patterns of common electrodes, which do not overlap with the pattern of the drains, on the base substrate; and forming the film of passivation layer on the base substrate formed with the patterns of the common electrodes, and forming the respective first via holes in the film of passivation layer and the respective insulating films provided above the respective drains by an etching process; and
the step of forming the patterns of the pixel electrodes and the connecting portions on the base substrate comprises forming on the pattern of the passivation layer the patterns of the pixel electrodes and the connecting portions electrically connected with each other, and the respective connecting portions are electrically connected with the respective drains through the respective first via holes.

8. The method according to claim 5, wherein:
the step of curing the insulating material remained above the patterns of the sources, the drains and the data lines comprises heating the insulating material remained above the patterns of the sources, the drains and the data lines, and a heating temperature is 150° C. to 220° C., and a time duration for heating is 10 minutes to 2 hours.

9. The method according to claim 5, wherein:
before forming the patterns of the sources, the drains and the data lines on the base substrate, the method further comprises:
forming patterns of gates and gate lines on the base substrate by a one-going patterning process;
forming a gate insulating layer on the base substrate formed with the patterns of the gates and the gate lines;
forming patterns of active layers on a region of the gate insulating layer corresponding to the gates; and
forming a pattern of an etch barrier layer on the base substrate formed with the patterns of the active layers.

10. A display device, comprising the array substrate according to claim 1.

11. The method according to claim 6, wherein:
before forming the patterns of the sources, the drains and the data lines on the base substrate, the method further comprises:
forming patterns of gates and gate lines on the base substrate by a one-going patterning process;
forming a gate insulating layer on the base substrate formed with the patterns of the gates and the gate lines;
forming patterns of active layers on a region of the gate insulating layer corresponding to the gates; and
forming a pattern of an etch barrier layer on the base substrate formed with the patterns of the active layers.

12. The method according to claim 7, wherein:
before forming the patterns of the sources, the drains and the data lines on the base substrate, the method further comprises:
forming patterns of gates and gate lines on the base substrate by a one-going patterning process;
forming a gate insulating layer on the base substrate formed with the patterns of the gates and the gate lines;
forming patterns of active layers on a region of the gate insulating layer corresponding to the gates; and
forming a pattern of an etch barrier layer on the base substrate formed with the patterns of the active layers.

13. The display device according to claim 10, wherein the array substrate further comprises:
active layers located under the respective sources and the respective drains and electrically connected with the respective sources and the respective drains; and
gates provided opposite to the respective active layers and insulated from the respective active layers.

* * * * *